(12) United States Patent
Nakamura

(10) Patent No.: US 11,810,985 B2
(45) Date of Patent: Nov. 7, 2023

(54) METHOD FOR MANUFACTURING SOLAR CELL, SOLAR CELL, SOLAR CELL DEVICE, AND SOLAR CELL MODULE

(71) Applicant: KANEKA CORPORATION, Osaka (JP)

(72) Inventor: Junichi Nakamura, Settsu (JP)

(73) Assignee: KANEKA CORPORATION, Osaka (JP)

( * ) Notice: Subject to any disclaimer, the term of this patent is extended or adjusted under 35 U.S.C. 154(b) by 44 days.

(21) Appl. No.: 17/585,780

(22) Filed: Jan. 27, 2022

(65) Prior Publication Data

US 2022/0149215 A1    May 12, 2022

Related U.S. Application Data

(63) Continuation of application No. PCT/JP2020/029125, filed on Jul. 29, 2020.

(30) Foreign Application Priority Data

Jul. 31, 2019  (JP) ................................. 2019-140793

(51) Int. Cl.
   *H01L 31/0224*   (2006.01)
   *H01L 31/05*     (2014.01)
   *H01L 31/18*     (2006.01)

(52) U.S. Cl.
   CPC .. *H01L 31/022458* (2013.01); *H01L 31/0508* (2013.01); *H01L 31/0516* (2013.01); *H01L 31/1884* (2013.01)

(58) Field of Classification Search
   CPC ......... H01L 31/022458; H01L 31/0508; H01L 31/0516; H01L 31/1884
   See application file for complete search history.

(56) References Cited

U.S. PATENT DOCUMENTS

| 2014/0124014 A1 | 5/2014 | Morad et al. |
| 2015/0059822 A1 | 3/2015 | Krokoszinski |

(Continued)

FOREIGN PATENT DOCUMENTS

| JP | 2009-076739 A | 4/2009 |
| JP | 2012-023412 A | 2/2012 |

(Continued)

OTHER PUBLICATIONS

International Search Report issued in PCT/JP2020/029125; dated Oct. 13, 2020.

(Continued)

*Primary Examiner* — Tae-Sik Kang
(74) *Attorney, Agent, or Firm* — Studebaker & Brackett PC (57) ABSTRACT

A method for manufacturing a solar cell comprising forming a series of transparent electrode layer material films on electroconductive semiconductor layers on the reverse surface side of a substrate; forming metal electrode layers on the transparent electrode layer material films; forming insulation layers covering the entirety of the metal electrode layers except for a first non-insulation region, and insulation layers covering the entirety of the metal electrode layers excluding a second non-insulation region; and forming patterned transparent electrode layers and leaving the insulation layers using an etching technique in which the insulation layers are masks. In the insulation layer formation, the first non-insulation region positioned on a first straight line extending in a first direction is formed in the insulation layers, and the second non-insulation region positioned on a second straight line, different from the first straight line, extending in the first direction is formed in the insulation layers.

2 Claims, 6 Drawing Sheets

(56) References Cited

U.S. PATENT DOCUMENTS

| | | |
|---|---|---|
| 2015/0243818 A1 | 8/2015 | Kim et al. |
| 2015/0287849 A1 | 10/2015 | Kim et al. |
| 2016/0268459 A1 | 9/2016 | Kimoto et al. |
| 2016/0276515 A1* | 9/2016 | Chang .................. H01L 31/074 |
| 2017/0104114 A1* | 4/2017 | Kim .................... H01L 31/0745 |
| 2018/0062012 A1 | 3/2018 | Yoshikawa et al. |
| 2018/0198011 A1 | 7/2018 | Jeon et al. |
| 2018/0233615 A1 | 8/2018 | Lim |

FOREIGN PATENT DOCUMENTS

| | | |
|---|---|---|
| JP | 2014-127550 A | 7/2014 |
| JP | 2015-159286 A | 9/2015 |
| JP | 2015-534288 A | 11/2015 |
| JP | 2017-135421 A | 8/2017 |
| JP | 2018-133567 A | 8/2018 |
| JP | 2018-137463 A | 8/2018 |
| JP | 2019-004155 A | 1/2019 |
| JP | 2019-079916 A | 5/2019 |
| JP | 2019-125658 A | 7/2019 |
| WO | 2014/074826 A2 | 5/2014 |
| WO | 2015/060437 A1 | 4/2015 |
| WO | 2016/158977 A1 | 10/2016 |

OTHER PUBLICATIONS

Tutsch Leonard et al., "Integrating Transparent Conductive Oxides to Improve the Infrared Response of Silicon Solar Cells with Passivating Rear Contacts", AIP Conference Proceedings, vol. 040023, Aug. 2018, XP093050576, pp. 1-6, DOI: 10.1063/1.5049286.

\* cited by examiner

METHOD FOR MANUFACTURING SOLAR CELL, SOLAR CELL, SOLAR CELL DEVICE, AND SOLAR CELL MODULE

CROSS-REFERENCE TO RELATED APPLICATIONS

This application claims benefit of priority to International Patent Application No. PCT/JP2020/029125, filed Jul. 29, 2020, and to Japanese Patent Application No. 2019-140793, filed Jul. 31, 2019, the entire contents of each are incorporated herein by reference.

BACKGROUND

Technical Field

The present disclosure relates to a method for manufacturing a solar cell, a solar cell, a solar cell device including the solar cell, and a solar cell module including the solar cell device.

Background Art

Japanese Unexamined Patent Application Publication No. 2018-133567, Japanese Unexamined Patent Application Publication No. 2015-159286 and Japanese Unexamined Patent Application Publication No. 2014-127550 disclose techniques for connecting electrodes of two polarities and wiring members in a solar cell of back contact type. That is Japanese Unexamined Patent Application Publication No. 2018-133567 and Japanese Unexamined Patent Application Publication No. 2015-159286 each describe a solar cell of back contact type in which first wiring lines and second wiring lines that intersect with first electrodes and second electrodes are provided; the first wiring lines are connected to the first electrodes at intersections between the first wiring lines and the first electrodes, and are insulated from the second electrodes at intersections between the first wiring lines and the second electrodes by an insulating layer; and the second wiring lines are connected to the second electrodes at intersections between the second wiring lines and the second electrodes, and are insulated from the first electrodes at intersections between the second wiring lines and the first electrodes by the insulating layer.

Japanese Unexamined Patent Application Publication No. 2014-127550 describes a solar cell of back contact type in which p-electrode wiring lines and n-electrode wiring lines that intersect with p-electrodes and n-electrodes are provided; an insulating resin is provided on the back side; the p-electrode wiring lines are connected to the p-electrodes at intersections between the p-electrode wiring lines and the p-electrodes by an electrically-conductive member in holes in the insulating resin, and are insulated from the n-electrodes at intersections between the p-electrode wiring lines and the n-electrodes by the insulating resin; and the n-electrode wiring lines are connected to the n-electrodes at intersections between the n-electrode wiring lines and the n-electrodes by the electrically-conductive member in the holes in the insulating resin, and are insulated from the p-electrodes at intersections between the n-electrode wiring lines and the p-electrodes by the insulating resin.

SUMMARY

The inventor seeks a cost reduction in a manufacturing process of solar cells such as described above. Accordingly, the present disclosure provides a method for manufacturing a solar cell that allows for a cost reduction, a solar cell, a solar cell device including the solar cell, and a solar cell module including the solar cell device.

The present disclosure is directed to a method for manufacturing a solar cell of back contact type. The solar cell includes a semiconductor substrate; a set of first conductivity-type semiconductor layers, a set of first transparent electrode layers, and a set of first metal electrode layers that are stacked in order on portions of one main surface of the semiconductor substrate; and a set of second conductivity-type semiconductor layers, a set of second transparent electrode layers, and a set of second metal electrode layers that are stacked in order on other portions of the one main surface of the semiconductor substrate. The method includes a transparent electrode layer material film formation step including forming a sheet of transparent electrode layer material film on the first conductivity-type semiconductor layers and the second conductivity-type semiconductor layers over the one main surface of the semiconductor substrate; a metal electrode layer formation step including forming the first metal electrode layers and the second metal electrode layers on the transparent electrode layer material film, the first metal electrode layers and the second metal electrode layers being spaced apart from one another; an insulating layer formation step including forming first insulating layers that entirely cover the respective first metal electrode layers except for first non-insulating regions and forming second insulating layers that entirely cover the respective second metal electrode layers except for second non-insulating regions, the first insulating layers and the second insulating layers being spaced apart from one another; and a transparent electrode layer formation step including removing unmasked portions of the transparent electrode layer material film by an etching method using the first insulating layers and the second insulating layers as masks to form patterned first transparent electrode layers and patterned second transparent electrode layers and to leave the first insulating layers and the second insulating layers unremoved. The insulating layer formation step includes forming the first non-insulating regions in the first insulating layers, the first non-insulating regions exposing the first metal electrode layers and being arranged on first straight lines extending in a first direction along the one main surface of the semiconductor substrate, and forming the second non-insulating regions in the second insulating layers, the second non-insulating regions exposing the second metal electrode layers and being arranged on second straight lines extending in the first direction and differing from the first straight lines.

The present disclosure is also directed to a solar cell of back contact type including a semiconductor substrate; a set of first conductivity-type semiconductor layers, a set of first transparent electrode layers, and a set of first metal electrode layers that are stacked in order on portions of one main surface of the semiconductor substrate; a set of second conductivity-type semiconductor layers, a set of second transparent electrode layers, and a set of second metal electrode layers that are stacked in order on other portions of the one main surface of the semiconductor substrate; first insulating layers that entirely cover the respective first metal electrode layers except for first non-insulating regions; and second insulating layers that entirely cover the respective second metal electrode layers except for second non-insulating regions. Regions between the first metal electrode layers and the second metal electrode layers, which are regions between the first transparent electrode layers and the second transparent electrode layers, are not covered by the first insulating layers or the second insulating layers. The first non-insulating regions are portions of each first insulating layer that are uncovered and expose the first metal electrode layers, and are arranged on first straight lines extending in a first direction along the one main surface of the semiconductor substrate. The second non-insulating regions are portions of each second insulating layer that are uncovered and expose the second metal electrode layers, and are arranged on second straight lines extending in the first direction and differing from the first straight lines.

The present disclosure is also directed to a solar cell device comprising a plurality of solar cells each being the solar cell described above; the first wiring members and the second wiring members described above, the first wiring members and the second wiring members electrically connecting adjacent solar cells to one another among the plurality of solar cells.

The present disclosure is also directed to a solar cell module including one or more solar cell devices each being the solar cell device described above.

According to the present disclosure, it is possible to provide a method for manufacturing a solar cell that allows for a cost reduction, a solar cell, a solar cell device including the solar cell, and a solar cell module including the solar cell device.

DETAILED DESCRIPTION

The following describes an example of an embodiment of the present disclosure with reference to the accompanying drawings. Note that the same or corresponding elements are given the same reference numerals throughout the drawings. In some drawings, hatching, reference numerals, or the like are omitted for the sake of simplicity, which can be compensated for by referring to other drawings.

Solar Cell Module

Figure 1:
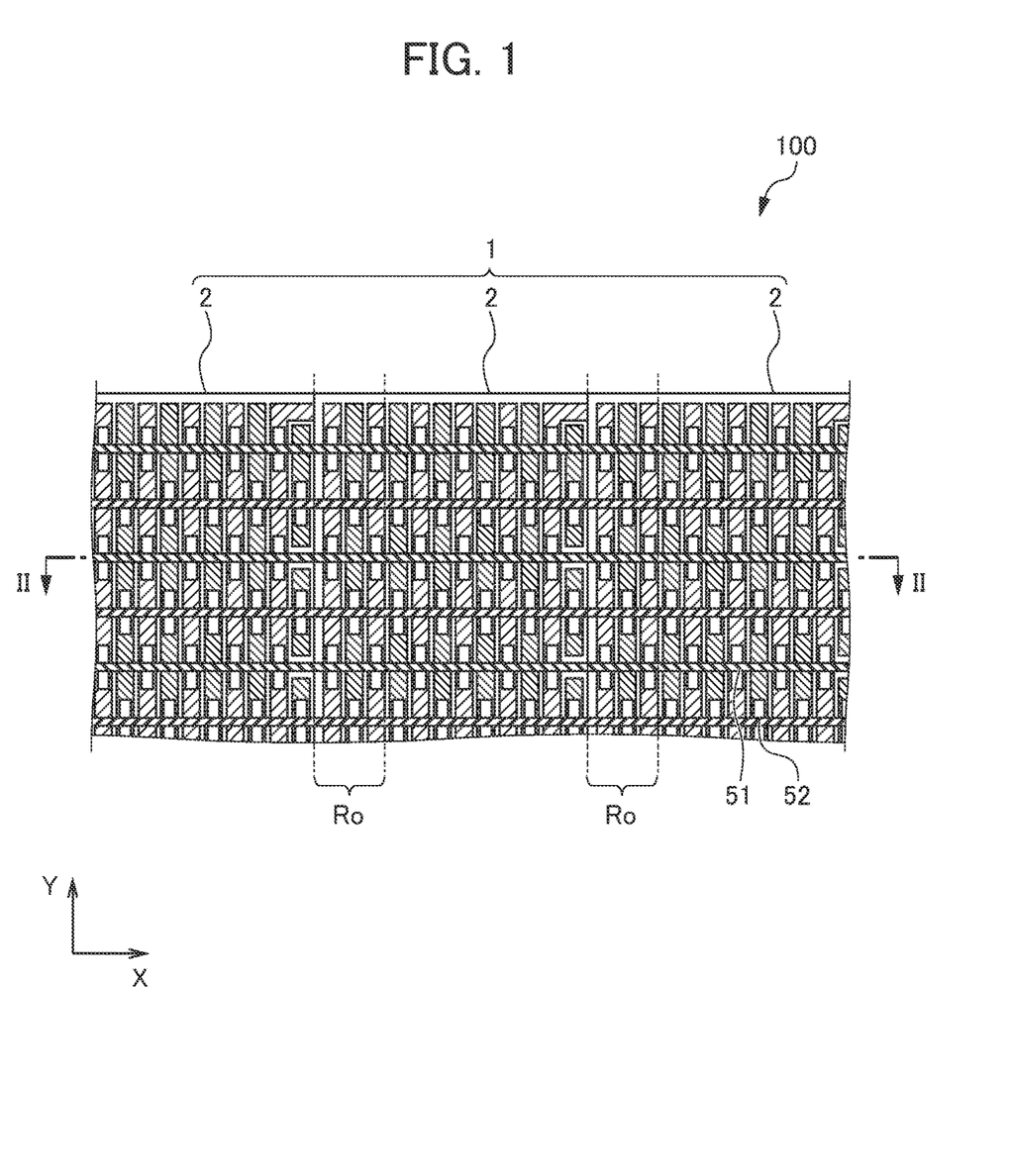
FIG. 1 is a back view of a solar cell module including a solar cell device according to an embodiment of the present disclosure.
Figure 2:
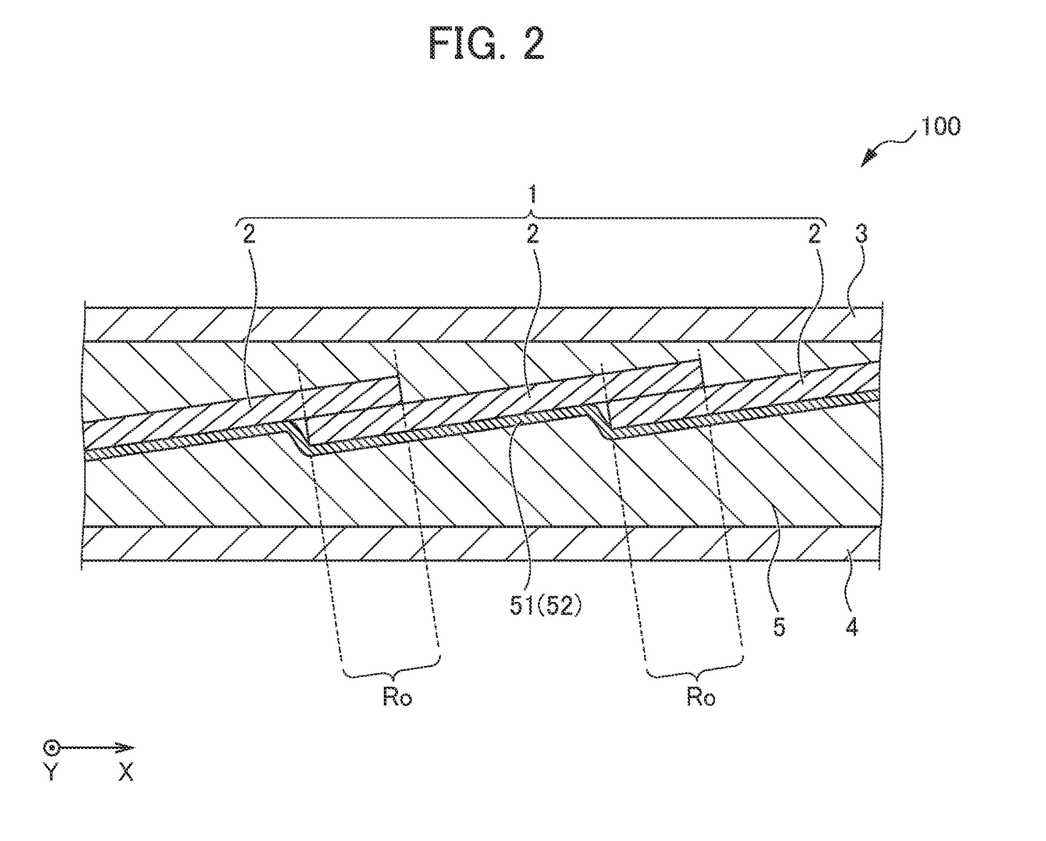
FIG. 2 is a cross-sectional view of the solar cell module along line II-II shown in FIG. 1.

FIG. 1 is a back view of a solar cell module including a solar cell device according to the present embodiment. FIG. 2 is a cross-sectional view of the solar cell module along line II-II shown in FIG. 1. In FIG. 1, a light receiving side protective member 3, a back side protective member 4, and a sealant 5, which will be described later, are omitted. FIGS. 1 and 2, and some other drawings described below show an XY Cartesian coordinate system. The XY plane extends along a light receiving surface and a back surface of the solar cell module.

As shown in FIGS. 1 and 2, a solar cell module 100 includes a solar cell device (also referred to as a solar cell string) 1 in which a plurality of solar cells 2 of back contact type (back junction type, which is also referred to as back electrode type) are electrically connected to one another using a shingling process.

The solar cell device 1 is held between the light receiving side protective member 3 and the back side protective member 4. The space between the light receiving side protective member 3 and the back side protective member 4 is filled with the sealant 5 in a liquid or solid state, thereby sealing the solar cell device 1.

The sealant 5 seals and protects the solar cell device 1, that is, the solar cells 2. The sealant 5 is provided between the light receiving side protective member 3 and light receiving surfaces of the solar cells 2, and between the back side protective member 4 and back surfaces of the solar cells 2. No particular limitations are placed on the shape of the sealant 5, and examples thereof include a sheet shape. The sealant 5 having a sheet shape easily covers the front and back surfaces of the solar cells 2 having a planar shape.

No particular limitations are placed on the material of the sealant 5. Preferably, the material of the sealant 5 has the property of transmitting light (translucency). Preferably, the material of the sealant 5 also has adhesiveness to bond the solar cells 2, the light receiving side protective member 3, and the back side protective member 4 together. Examples of such materials include translucent resins such as ethylene-vinyl acetate copolymers (EVA), ethylene-α-olefin copolymers, ethylene-vinyl acetate-triallyl isocyanurate (EVAT), polyvinyl butyrate (PVB), acrylic resins, urethane resins, or silicone resins.

The light receiving side protective member 3 covers the front surface (light receiving surface) of the solar cell device 1, that is, the front surfaces (light receiving surfaces) of the solar cells 2, with the sealant 5 therebetween to protect the solar cells 2. No particular limitations are placed on the shape of the light receiving side protective member 3. Preferably, in terms of indirectly covering the planar light receiving surface, the light receiving side protective member 3 has a plate shape or a sheet shape.

No particular limitations are placed on the material of the light receiving side protective member 3. Preferably, the material has ultraviolet resistance while having translucency as in the case of the sealant 5, and examples thereof include glass and transparent resins such as acrylic resins or polycarbonate resins. A surface of the light receiving side protective member 3 may be processed to have bumps and dips, or may be covered with an antireflection coating layer. Such a surface makes the light receiving side protective member 3 less reflective to incident light, so that more light is introduced into the solar cell device 1.

The back side protective member 4 covers the back surface of the solar cell device 1, that is, the back surfaces of the solar cells 2, with the sealant 5 therebetween to protect the solar cells 2. No particular limitations are placed on the shape of the back side protective member 4. Preferably, in terms of indirectly covering the planar back surface, the back side protective member 4 has a plate shape or a sheet shape as in the case of the light receiving side protective member 3.

No particular limitations are placed on the material of the back side protective member 4. Preferably, the material is capable of preventing permeation of water and the like (is highly water-impermeable). Examples thereof include: resin films such as of polyethylene terephthalate (PET), polyethylene (PE), olefin-based resins, fluorine-containing resins, or silicone-containing resins; and a laminate of a metal foil such as an aluminum foil and glass or a translucent plate-shaped resin member such as polycarbonate or an acrylic resin.

Solar Cell Device

In the solar cell device 1, the solar cells 2 are connected in series to one another, with end portions of the solar cells 2 partially overlapped. Specifically, a one end (left end in FIG. 2) portion of the light receiving surface of one solar cell 2 of adjacent solar cells 2 and 2 in the X direction is disposed under an opposite end (right end in FIG. 2) portion of the back surface of the other solar cell 2 in the X direction.

Thus, like tiles on a roof, the plurality of solar cells 2 are in a stacked structure in which the solar cells 2 are uniformly tilted in one direction. This process for electrically connecting the solar cells 2 to one another as described above is referred to as the shingling process. The plurality of solar cells 2 connected into a string form is referred to as a solar cell string (solar cell device). Hereinafter, regions where adjacent solar cells 2 and 2 are overlapped are referred to as overlap regions Ro.

First wiring members 51 and second wiring members 52 are disposed across each pair of adjacent solar cells 2 and 2, electrically connecting the adjacent solar cells 2 and 2 to one another. The details of the first wiring members 51 and the second wiring members 52 will be described below. The following describes the solar cells 2 in the solar cell device 1.

Solar Cell

Figure 3:
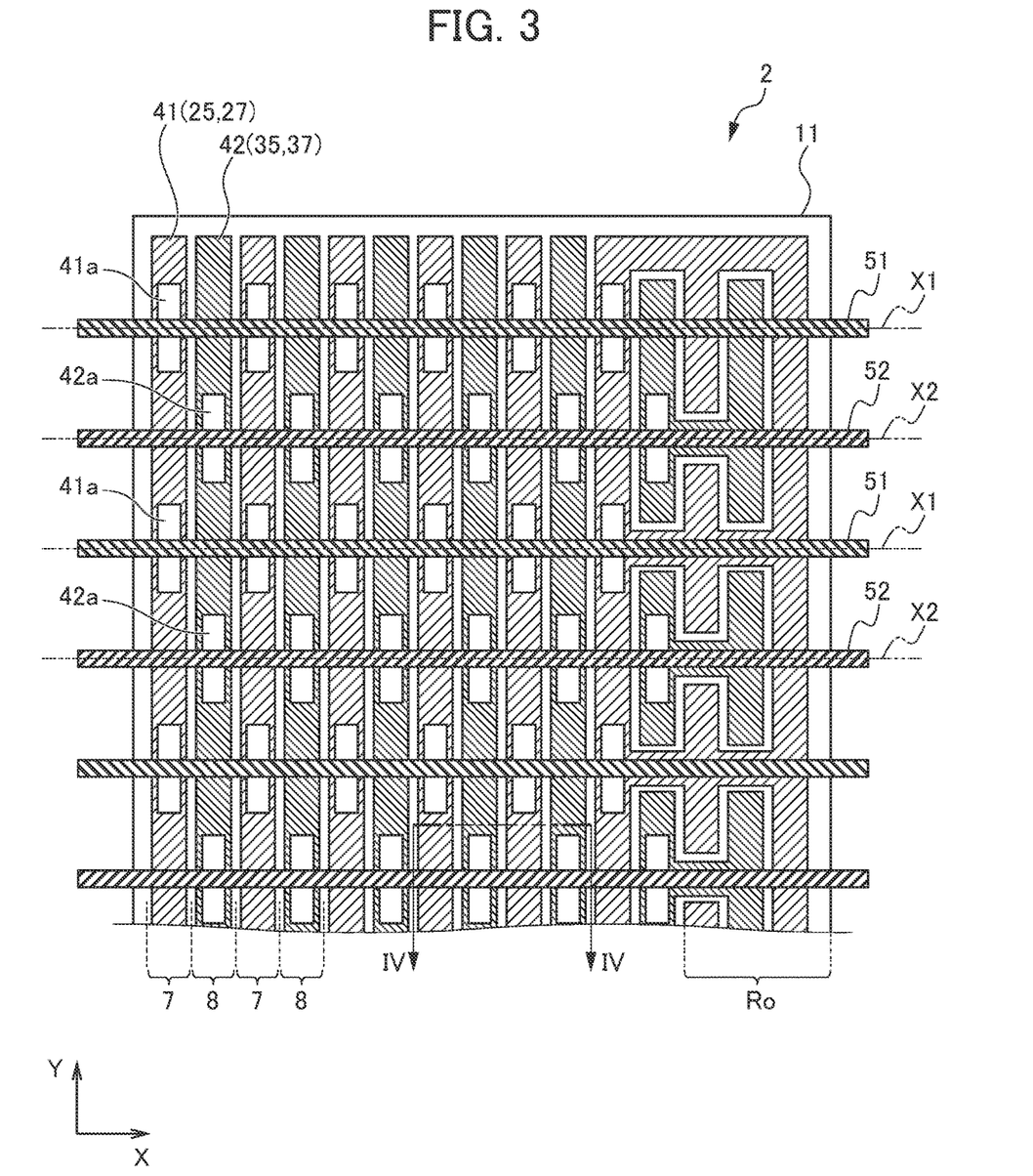
FIG. 3 is a back view of a solar cell in the solar cell device shown in FIGS. 1 and 2.

FIG. 3 is a back view of a solar cell 2 in the solar cell device 1 shown in FIGS. 1 and 2. The solar cell 2 shown in FIG. 3 includes a semiconductor substrate 11 having two main surfaces, and one of the main surfaces of the semiconductor substrate 11 has first regions 7 and second regions 8. Of the main surfaces of the semiconductor substrate 11, the main surface on the light receiving side is referred to below as a light receiving surface, and the main surface (one main surface) on the opposite side to the light receiving surface is referred to below as a back surface.

The first regions 7 each have a strip-like shape and extend in the Y direction (second direction). Likewise, the second regions 8 each have a strip-like shape and extend in the Y direction. The first regions 7 and the second regions 8 are alternately provided in the X direction (first direction) intersecting with the Y direction.

Figure 4:
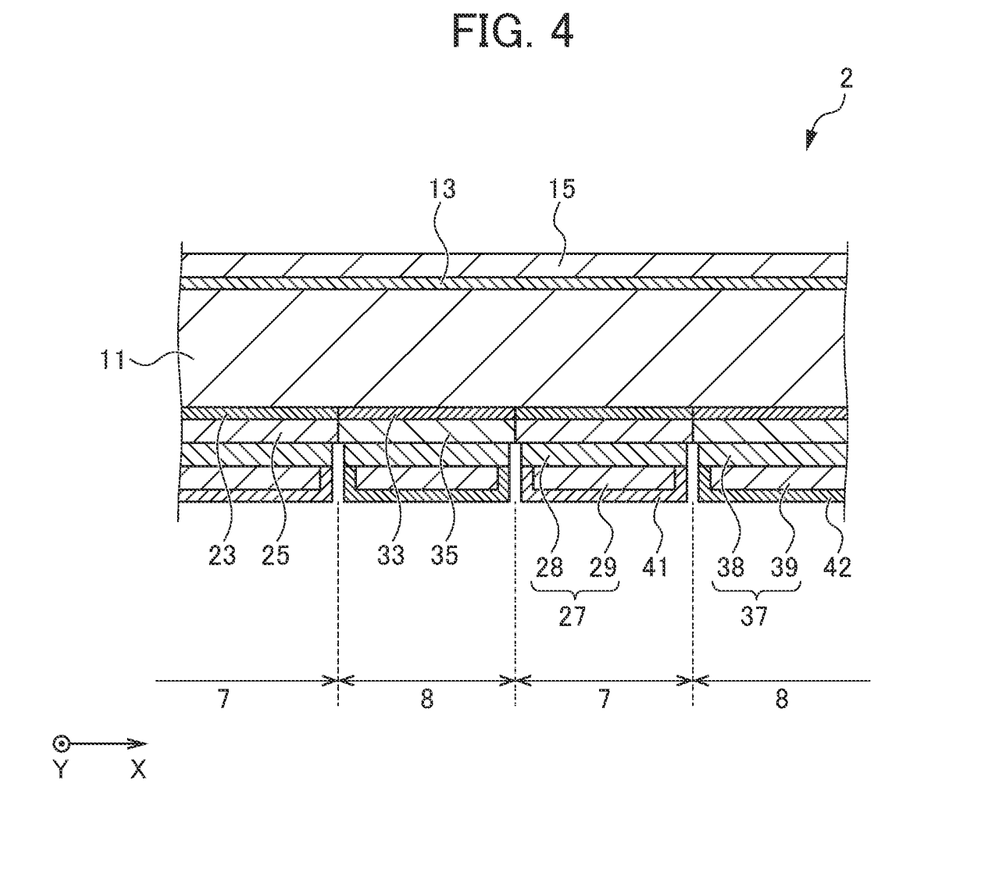
FIG. 4 is a cross-sectional view of the solar cell along line IV-IV shown in FIG. 3.

FIG. 4 is a cross-sectional view of the solar cell 2 along line IV-IV shown in FIG. 3. As shown in FIG. 4, the solar cell 2 includes a passivation layer 13 and an antireflection layer 15 that are stacked in order on the light receiving surface of the semiconductor substrate 11. The solar cell 2 also includes a set of passivation layers 23, a set of first conductivity-type semiconductor layers 25, a set of first electrode layers 27 (first transparent electrode layers 28 and first metal electrode layers 29 described below), and a set of first insulating layers 41 that are stacked in order on portions (first regions 7) of the back surface of the semiconductor substrate 11. The solar cell 2 further includes a set of passivation layers 33, a set of second conductivity-type semiconductor layers 35, a set of second electrode layers 37 (second transparent electrode layers 38 and second metal electrode layers 39 described below), and a set of second insulating layers 42 that are stacked in order on other portions (second regions 7) of the back surface of the semiconductor substrate 11.

The semiconductor substrate 11 is formed from a crystalline silicon material such as single-crystal silicon or polycrystal silicon. The semiconductor substrate 11 is, for example, an n-type semiconductor substrate including a crystalline silicon material doped with an n-type dopant. The n-type dopant is, for example, phosphorus (P). The semiconductor substrate 11 functions as a photoelectric conversion substrate that generates photocarriers (electrons and holes) by absorbing light incident on the light receiving surface.

The use of crystalline silicon as the material of the semiconductor substrate 11 helps keep dark current relatively low and produce relatively high power (stable power regardless of illumination intensity) even if the intensity of the incident light is low.

The passivation layer 13 is provided on the light receiving surface of the semiconductor substrate 11. The passivation layers 23 are provided in the first regions 7 of the back surface of the semiconductor substrate 11. The passivation layers 33 are provided in the second regions 8 of the back surface of the semiconductor substrate 11. The passivation layers 13, 23, and 33 are formed from, for example, an intrinsic (i-type) amorphous silicon material. The passivation layers 13, 23, and 33 suppress recombination of carriers generated in the semiconductor substrate 11 to increase the carrier collection efficiency.

The antireflection layer 15 is provided on the intrinsic semiconductor layer 13 on the light receiving surface of the semiconductor substrate 11. The antireflection layer 15 functions as an antireflection layer for preventing reflection of incident light and functions as a protective layer for protecting the light receiving surface of the semiconductor substrate 11 and the intrinsic semiconductor layer 13. The antireflection layer 15 is formed from, for example, an insulator material such as silicon oxide (SiO), silicon nitride (SiN), or a composite thereof such as silicon oxynitride (SiON).

The first conductivity-type semiconductor layers 25 are provided on the passivation layers 23, that is, in the first regions 7 of the back surface of the semiconductor substrate 11. The second conductivity-type semiconductor layers 35 are provided on the passivation layers 33, that is, in the second regions 8 of the back surface of the semiconductor substrate 11. That is, the first conductivity-type semiconductor layers 25 and the second conductivity-type semiconductor layers 35 each have a strip-like shape and extend in the Y direction. The first conductivity-type semiconductor layers 25 and the second conductivity-type semiconductor layers 35 are alternately provided in the X direction. It is necessary that in each overlap region Ro, the first conductivity-type semiconductor layers 25 form a continuous pattern, and the second conductivity-type semiconductor layers 35 form a continuous pattern.

The first conductivity-type semiconductor layers 25 are formed from, for example, an amorphous silicon material. The first conductivity-type semiconductor layers 25 are, for example, p-type semiconductor layers including an amorphous silicon material doped with a p-type dopant. The p-type dopant is, for example, boron (B).

The second conductivity-type semiconductor layers 35 are formed from, for example, an amorphous silicon material. The second conductivity-type semiconductor layers 35 are, for example, n-type semiconductor layers including an amorphous silicon material doped with an n-type dopant (for example, phosphorus (P) as mentioned above).

Note that the first conductivity-type semiconductor layers 25 may alternatively be n-type semiconductor layers, and the second conductivity-type semiconductor layers 35 may alternatively be p-type semiconductor layers. The semiconductor substrate 11 may alternatively be a p-type semiconductor substrate including a crystalline silicon material doped with a p-type dopant (for example, boron (B) as mentioned above).

The first electrode layers 27 are provided on the first conductivity-type semiconductor layers 25, that is, in the first regions 7 of the back surface of the semiconductor substrate 11. Each of the first electrode layers 27 includes the first transparent electrode layer 28 and the first metal electrode layer 29 stacked in order on the corresponding first conductivity-type semiconductor layer 25. The second electrode layers 37 are provided on the second conductivity-type semiconductor layers 35, that is, in the second regions 8 of the back surface of the semiconductor substrate 11. Each of the second electrode layers 37 includes the second transparent electrode layer 38 and the second metal electrode layer 39 stacked in order on the corresponding second conductivity-type semiconductor layer 35. That is, the first metal electrode layers 29 and the second metal electrode layers 39 each have a strip-like shape and extend in the Y direction. The first metal electrode layers 29 and the second metal electrode layers 39 are alternately provided in the X direction. It is necessary that in each overlap region Ro, the first metal electrode layers 29 form a continuous pattern, and the second metal electrode layers 39 form a continuous pattern.

The first transparent electrode layers 28 and the second transparent electrode layers 38 are formed from a transparent electrically-conductive material. Examples of transparent electrically-conductive materials include indium tin oxide (ITO, a complex oxide of indium oxide and tin oxide) and zinc oxide (ZnO).

The first metal electrode layers 29 and the second metal electrode layers 39 are formed from a metal material. Examples of usable metal materials include Cu, Ag, Al, and alloys thereof. The first metal electrode layers 29 and the second metal electrode layers 39 may be, for example, formed from an electrically-conductive paste material containing metal powder such as silver.

The first insulating layers 41 are provided on the first metal electrode layers 29, that is, in the first regions 7 of the back surface of the semiconductor substrate 11. The second insulating layers 42 are provided on the second metal electrode layers 39, that is, in the second regions 8 of the back surface of the semiconductor substrate 11. That is, the first insulating layers 41 and the second insulating layers 42 each have a strip-like shape and extend in the Y direction as shown in FIG. 3. The first insulating layers 41 and the second insulating layers 42 are alternately provided in the X direction. It is necessary that in each overlap region Ro, the first insulating layers 41 form a continuous pattern, and the second insulating layers 42 form a continuous pattern.

The first insulating layers 41 entirely cover the respective first metal electrode layers 29 except for first non-insulating regions 41a. Likewise, the second insulating layers 42 entirely cover the respective second metal electrode layers 39 except for second non-insulating regions 42a.

The first non-insulating regions 41a are openings in each first insulating layer 41 that are uncovered and expose the first metal electrode layers 29. The first non-insulating regions 41a are arranged on first straight lines X1 extending in the X direction (first direction). Likewise, the second non-insulating regions 42a are openings in each second insulating layer 42 that are uncovered and expose the second metal electrode layers 39. The second non-insulating regions 42a are arranged on second straight lines X2 extending in the X direction (first direction) and differing from the first straight lines X1. The first straight lines X1 and the second straight lines X2 intersect with the first metal electrode layers 29 and the second metal electrode layers 39, and are alternately arranged in the Y direction (second direction).

All or some of the first non-insulating regions 41a have a greater width in the Y direction (second direction) than the first wiring members 51. Likewise, all or some of the second non-insulating regions 42a have a greater width in the Y direction (second direction) than the second wiring members 52. For example, the first non-insulating regions 41a and the second non-insulating regions 42a have a width of 1 mm or more and 50 mm or less (i.e., from 1 mm to 50 mm). This configuration makes it possible to secure an alignment clearance when the wiring members are connected.

No particular limitations are placed on the material of the first insulating layers 41 and the second insulating layers 42. Examples thereof include resins such as acrylic, vinyl chloride, polyurethane, polyester, nylon, phenol, or epoxy resins. Other examples thereof include inorganic pigments, organic pigments, ceramics, metal oxides, and glass. The first insulating layers 41 and the second insulating layers 42 may contain a resin material. The resin material helps reduce the stress on the end portions of the solar cells in the shingling structure due to temperature changes.

As shown in FIG. 3, the first electrode layers 27 and the second electrode layers 37 are separated at boundaries between the first regions 7 and the second regions 8. That is, the first transparent electrode layers 28 and the second transparent electrode layers 38 are spaced apart from one another, and the first metal electrode layers 29 and the second metal electrode layers 39 are spaced apart from one another. The first insulating layers 41 and the second insulating layers 42 are also separated.

Regions between the first metal electrode layers 29 and the second metal electrode layers 39, which are regions between the first transparent electrode layers 28 and the second transparent electrode layers 38, are not covered by the first insulating layers 41 or the second insulating layers 42.

A main surface of each first metal electrode layer 29 is in contact with the corresponding first transparent electrode layer 28, and an opposite main surface and side surfaces thereof are covered by the corresponding first insulating layer 41. Likewise, a main surface of each second metal electrode layer 39 is in contact with the corresponding second transparent electrode layer 38, and an opposite main surface and side surfaces thereof are covered by the corresponding second insulating layer 42.

Side surfaces of the first transparent electrode layers 28 are not covered by the first insulating layers 41. Likewise, side surfaces of the second transparent electrode layers 38 are not covered by the second insulating layers 42.

As shown in FIG. 3, the first wiring members 51 extend in the X direction (first direction) along the first straight lines X1. Likewise, the second wiring members 52 extend in the X direction (first direction) along the second straight lines X2. That is, the first wiring members 51 and the second wiring members 52 intersect with the first metal electrode layers 29 and the second metal electrode layers 39, and are alternately arranged in the Y direction (second direction).

The first wiring members 51 are electrically connected to the first metal electrode layers 29 in the first non-insulating regions 41a of the first insulating layers 41 and are prevented from being electrically connected to the second metal electrode layers 39 by the second insulating layers 42. Likewise, the second wiring members 52 are electrically connected to the second metal electrode layers 39 in the second non-insulating regions 42a of the second insulating layers 42 and are prevented from being electrically connected to the first metal electrode layers 29 by the first insulating layers 41.

The center-to-center distance (pitch) between the first wiring members 51 and the second wiring members 52 in the Y direction is longer than the center-to-center distance (pitch) between the first metal electrode layers 29 and the second metal electrode layers 39 in the X direction. For example, the center-to-center distance (pitch) between the first wiring members 51 and the second wiring members 52 is 5 mm or more and 50 mm or less (i.e., from 5 mm to 50 mm). This configuration makes it possible to shorten paths of current flowing through the metal electrode layers, to reduce power losses resulting from electrode resistance, and to improve the power generation efficiency of the solar cell.

Examples of members usable as the first wiring members 51 and the second wiring members 52 include ribbon wires each including a copper core material covered with a low melting point metal or a solder; electrically-conductive films formed from thermosetting resin films containing low melting point metal particles or metal microparticles; and braided or woven wires obtained by braiding or weaving a plurality of electrically-conductive strands (see, for example, Japanese Unexamined Patent Application, Publication No. 2016-219799 or Japanese Unexamined Patent Application, Publication No. 2014-3161).

Examples of braided wires include those having a width of 0.2 mm or more and 5 mm or less (i.e., from 0.2 mm to 5 mm), and a thickness of 5 μm or more and 1 mm or less (i.e., from 5 μm to 1 mm). The use of stretchable braided wires as the wiring members for connecting the electrodes in the solar cell helps reduce the stress on the electrodes due to temperature changes during, for example, manufacturing. The use of stretchable braided wires as the wiring members for connecting solar cells also helps reduce the stress on the end portions of the solar cells in the shingling structure.

The braided wires may be coated with a solder. Plating (coating) the braided wires with a low temperature melting solder enables simultaneous multi-point solder connection in portions of the braided wires and eliminates a process such as application of an electrically-conductive paste.

Examples of usable solders include solders having a higher melting point than a lamination temperature of the layers of the solar cell, such as Sn—Bi solder. As a result of the solder having a melting point higher than the lamination temperature of the layers of the solar cell, unnecessary melting of the solder can be prevented throughout the braided wires.

Solar Cell Manufacturing Method

Figure 5A:
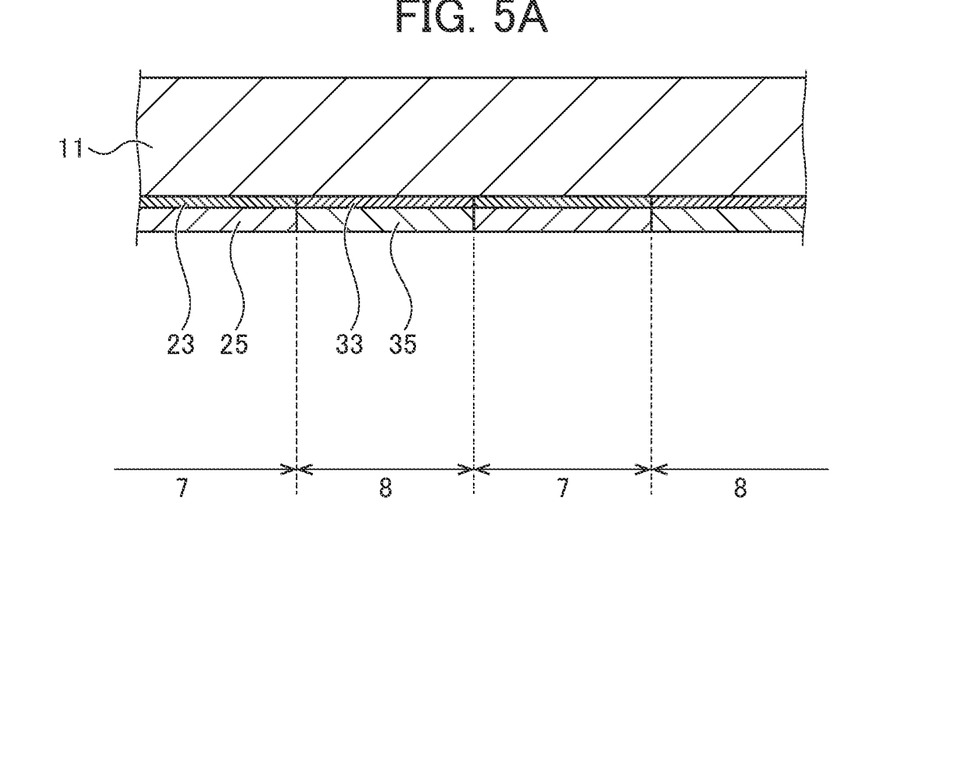
FIG. 5A is a diagram illustrating a semiconductor layer formation step in a solar cell manufacturing method according to the embodiment.
Figure 5B:
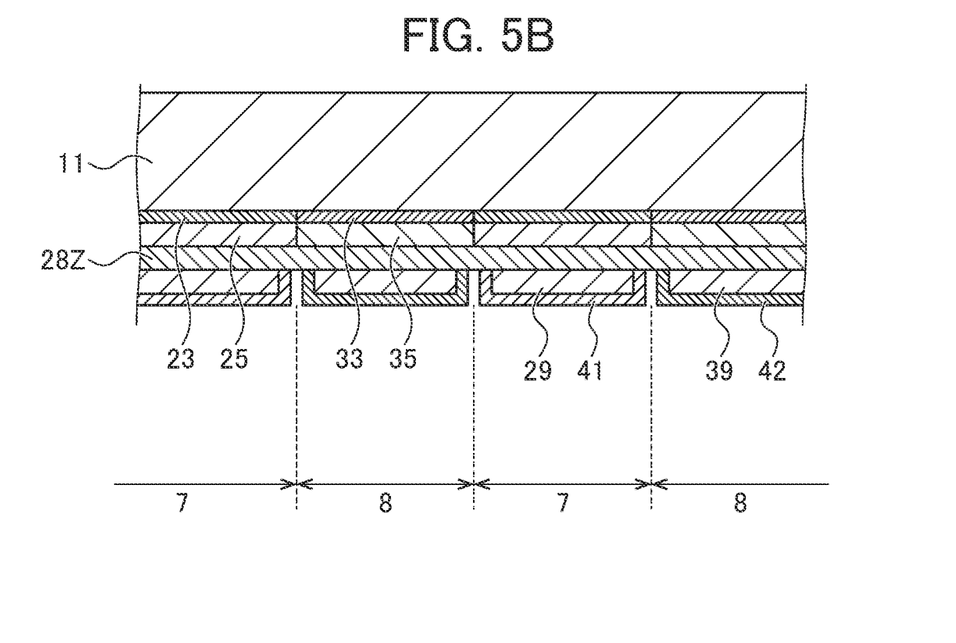
FIG. 5B is a diagram illustrating a transparent electrode layer material film formation step, a metal electrode layer formation step, and an insulating layer formation step in the solar cell manufacturing method according to the embodiment.
Figure 5C:
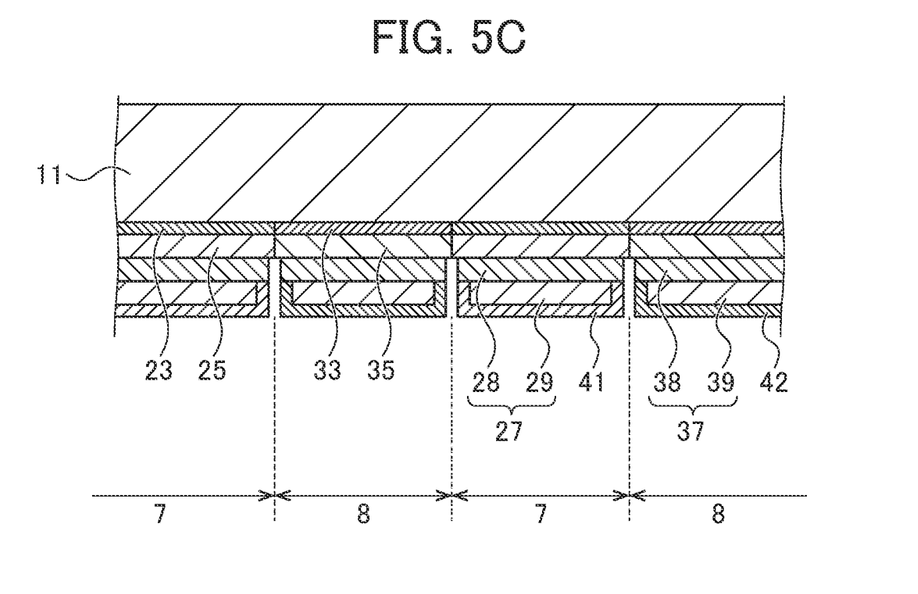
FIG. 5C is a diagram illustrating a transparent electrode layer formation step in the solar cell manufacturing method according to the embodiment.

The following describes a solar cell manufacturing method according to the present embodiment with reference to FIGS. 5A to 5C. FIG. 5A is a diagram illustrating a semiconductor layer formation step in the solar cell manufacturing method according to the present embodiment. FIG. 5B is a diagram illustrating a transparent electrode layer material film formation step, a metal electrode layer formation step, and an insulating layer formation step in the solar cell manufacturing method according to the present embodiment. FIG. 5C is a diagram illustrating a transparent electrode layer formation step in the solar cell manufacturing method according to the present embodiment. FIGS. 5A to 5C show the back side of the semiconductor substrate 11 and does not show the front side of the semiconductor substrate 11.

First, as shown in FIG. 5A, the passivation layers 23 and the first conductivity-type semiconductor layers 25 are formed on portions, which specifically are the first regions 7, of the back surface of the semiconductor substrate 11 (semiconductor layer formation step). For example, a passivation layer material film and a first conductivity-type semiconductor layer material film may be formed on the entire back surface of the semiconductor substrate 11 by a chemical vapor deposition (CVD) method or a physical vapor deposition (PVD) method, and then the passivation layers 23 and the first conductivity-type semiconductor layers 25 may be formed through patterning by an etching method with the use of a resist or a metal mask generated using a photolithography technique.

An acidic solution such as ozone-containing hydrofluoric acid or a liquid mixture of nitric acid and hydrofluoric acid may be mentioned as an example of an etching solution for a p-type semiconductor layer material film. An alkaline solution such as an aqueous potassium hydroxide solution may be mentioned as an example of an etching solution for an n-type semiconductor layer material film.

Alternatively, the film formation and the patterning for the passivation layers 23 and the p-type semiconductor layers 25 may be simultaneously performed using a mask when the passivation layers and the first conductivity-type semiconductor layers are stacked on the back surface of the semiconductor substrate 11 by the CVD method or the PVD method.

Next, the passivation layers 33 and the second conductivity-type semiconductor layers 35 are formed on other portions, which specifically are the second regions 8, of the back surface of the semiconductor substrate 11 (semiconductor layer formation step). For example, as in the case of the foregoing, a passivation layer material film and a second conductivity-type semiconductor layer material film may be formed on the entire back surface of the semiconductor substrate 11 by a CVD method or a PVD method, and then the passivation layers 33 and the second conductivity-type semiconductor layers 35 may be formed through patterning by an etching method with the use of a resist or a metal mask generated using a photolithography technique.

Alternatively, the film formation and the patterning for the passivation layers 33 and the second conductivity-type semiconductor layers 35 may be simultaneously performed using a mask when the passivation layers and the second conductivity-type semiconductor layers are stacked on the back surface of the semiconductor substrate 11 by the CVD method or the PVD method.

Note that in this semiconductor layer formation step, the passivation layer 13 may be formed on the entire light receiving surface of the semiconductor substrate 11 (not shown).

Next, as shown in FIG. 5B, a sheet of transparent electrode layer material film 28Z is formed on and across the first conductivity-type semiconductor layers 25 and the second conductivity-type semiconductor layers 35 (transparent electrode layer material film formation step). The transparent electrode layer material film 28Z is formed, for example, by a CVD method or a PVD method.

Next, the strip-like first metal electrode layers 29 extending in the Y direction are formed on the first conductivity-type semiconductor layers 25 with the transparent electrode layer material film 28Z therebetween, and the strip-like second metal electrode layers 39 extending in the Y direction are formed on the second conductivity-type semiconductor layers 35 with the transparent electrode layer material film 28Z therebetween (metal electrode layer formation step). Note that the first metal electrode layers 29 and the second metal electrode layers 39 are spaced apart from one another. Examples of methods for forming the first metal electrode layers 29 and the second metal electrode layers 39 include a PVD method, a screen printing method, an inkjet method, a gravure coating method, and a dispensing method.

Next, the first insulating layers 41 are formed to entirely cover the respective first metal electrode layers 29 except for the first non-insulating regions 41a, and the second insulating layers 42 are formed to entirely cover the respective second metal electrode layers 39 except for the second non-insulating regions 42a (insulating layer formation step). Note that the first insulating layers 41 and the second insulating layers 42 are spaced apart from one another. Furthermore, as shown in FIG. 3, the first non-insulating regions 41a of the first insulating layers 41 are formed to expose the first metal electrode layers 29 while being arranged on the first straight lines X1 extending in the X direction. Likewise, the second non-insulating regions 42a of the second insulating layers 42 are formed to expose the second metal electrode layers 39 while being arranged on the second straight lines X2 extending in the X direction and differing from the first straight lines X1.

Examples of methods for forming the first insulating layers 41 and the second insulating layers 42 include a PVD method, a CVD method, a screen printing method, an inkjet method, a gravure coating method, and a dispensing method.

Next, as shown in FIG. 5C, the first transparent electrode layers 28 and the second transparent electrode layers 38 that are separated from one another are formed through patterning of the transparent electrode layer material film 28Z by an etching method using the first insulating layers 41 and the second insulating layers 42 (the first metal electrode layers 29 and the second metal electrode layers 39 in the first non-insulating regions 41a and the second non-insulating regions 42a) as masks (transparent electrode layer formation step). In the patterning, the first insulating layers 41 and the second insulating layers 42 are left unremoved.

A solution that does not eat away at the first metal electrode layers 29 exposed in the first non-insulating regions 41a or the second metal electrode layers 39 exposed in the second non-insulating regions 42a may be mentioned as an etching solution for the transparent electrode layer material film 28Z, and examples thereof include an acidic solution such as hydrochloric acid (HCl).

Thereafter, the antireflection layer 15 is formed over the entire light receiving surface of the semiconductor substrate 11 (not shown). Through the above-described steps, the solar cell 2 of back contact type according to the present embodiment shown in FIGS. 3 and 4 is obtained.

The solar cell device 1 and the solar cell module 100 according to the present embodiment are obtained by connecting a plurality of solar cells 2 to one another with the end portions of the solar cells 2 partially overlapped using the shingling process, as shown in FIGS. 1 and 2.

As described above, in the solar cell manufacturing method according to the present embodiment, the insulating layers 41 and 42 for ensuring insulation from the wiring members 51 and 52 are used as etching resists for the transparent electrode layers 28 and 29. It is therefore possible to omit steps for forming and removing etching resists for the transparent electrode layers 28 and 29, allowing for simplification and a reduction in cost of the solar cell manufacturing process.

In the solar cell 2 according to the present embodiment, the first insulating layers 41 entirely cover the respective strip-like first metal electrode layers 29 extending in the Y direction (second direction) except for the first non-insulating regions 41a, the second insulating layers 42 entirely cover the respective strip-like second metal electrode layers 39 extending in the Y direction except for the second non-insulating regions 42a, the first non-insulating regions 41a are arranged on the first straight lines X1 extending in the X direction (first direction) intersecting with the Y direction, and the second non-insulating regions 42a are arranged on the second straight lines X2 extending in the X direction (first direction) and differing from the first straight lines X1. In this configuration, the first wiring members 51 disposed along the first straight lines X1 are electrically connected to the first metal electrode layers 29 in the first non-insulating regions 41a and are insulated from the second metal electrode layers 39 by the second insulating layers 42. Likewise, the second wiring members 52 disposed along the second straight lines X2 are electrically connected to the second metal electrode layers 39 in the second non-insulating regions 42a and are insulated from the first metal electrode layers 29 by the first insulating layers 41. This configuration makes it possible to easily connect the strip-like electrode layers in the solar cell 2 using the wiring members and to easily avoid electrical shorts (shorting) between the electrodes.

This configuration also makes it possible to shorten the paths of current flowing through the metal electrode layers, owing to the alternate arrangement of the first wiring members 51 and the second wiring members 52. As a result, it is possible to reduce power losses resulting from electrode resistance and to improve the power generation efficiency of the solar cell.

Furthermore, the above-described configuration requires no busbar electrodes or pad electrodes for wiring connections, making it possible to reduce photoelectric conversion losses resulting from carrier recombination in bus bar electrodes and pad electrodes, which have relatively large areas. Since no busbar electrodes or pad electrodes having relatively large areas are used, it is possible to reduce the amount of expensive electrode materials such as Ag to be used.

Furthermore, in the solar cell 2 according to the present embodiment, the first insulating layers 41 entirely cover the respective first metal electrode layers 29 and the second insulating layers 42 entirely cover the respective second metal electrode layers 39, making it possible to avoid electrical shorts (shorting) between the electrodes even in the configuration in which the metal electrode layers have a wide width and a short electrode-to-electrode distance. As a result, it is possible to reduce electrode resistance and to improve the power generation efficiency of the solar cell.

In the solar cell device 1 and the solar cell module 100 according to the present embodiment, the plurality of solar cells 2 are electrically connected to one another with the end portions of the solar cells 2 partially overlapped using the shingling process. This configuration allows more solar cells 2 to be mounted within a limited solar cell mounting area of the solar cell device 1 and the solar cell module 100, increasing the light receiving area for photoelectric conversion and increasing the power of the solar cell device 1 and the solar cell module 100. This configuration also improves the design of the solar cell device 1 and the solar cell module 100, because there is no gap between the solar cells 2.

Furthermore, since solar cells of back contact type are used in the solar cell device 1 and the solar cell module 100 according to the present embodiment, the electrodes and wiring lines are not visible, further improving the design of the solar cell device 1 and the solar cell module 100.

Although an embodiment of the present disclosure has been described above, the above-described embodiment is not intended to limit the present disclosure and may be altered or modified in various ways. For example, for the above-described embodiment, the solar cell device and the solar cell module are mentioned by way of example in which a plurality of solar cells are electrically connected to one another using the shingling process. However, the solar cell according to the present disclosure is not limited as such, and is applicable to various solar cell devices and solar cell modules. For example, the solar cell according to the present disclosure is also applicable to solar cell devices and solar cell modules in which a plurality of solar cells arranged in a plane and spaced apart from one another by a predetermined insulation distance are electrically connected to one another without using the shingling process.

Furthermore, for the above-described embodiment, the solar cell 2 in which a crystalline silicon material is used is mentioned by way of example. However, the present disclosure is not limited as such. For example, various other materials such as gallium arsenide (GaAs) may be used in the solar cell.

Furthermore, for the above-described embodiment, the solar cell 2 of heterojunction type as shown in FIG. 4 is mentioned by way of example. However, the present disclosure is not limited as such, and is applicable to various solar cells such as homojunction type solar cells.

Furthermore, for the above-described embodiment, the solar cell module including a single solar cell device 1 is mentioned by way of example. However, the solar cell module may include a plurality of solar cell devices 1 arranged in the Y direction, for example.

What is claimed is:

1. A method for manufacturing a solar cell of back contact type, the solar cell comprising:
   a semiconductor substrate;
   a set of first conductivity-type semiconductor layers, a set of first transparent electrode layers, and a set of first metal electrode layers that are stacked in order on portions of one main surface of the semiconductor substrate; and
   a set of second conductivity-type semiconductor layers, a set of second transparent electrode layers, and a set of second metal electrode layers that are stacked in order on other portions of the one main surface of the semiconductor substrate,
   the method comprising:
   forming a sheet of transparent electrode layer material film on the first conductivity-type semiconductor layers and the second conductivity-type semiconductor layers over the one main surface of the semiconductor substrate;
   forming the first metal electrode layers and the second metal electrode layers on the transparent electrode layer material film, the first metal electrode layers and the second metal electrode layers being spaced apart from one another;
   forming first insulating layers that entirely cover the respective first metal electrode layers except for first non-insulating regions, and second insulating layers that entirely cover the respective second metal electrode layers except for second non-insulating regions, the first insulating layers and the second insulating layers being spaced apart from one another; and
   removing unmasked portions of the transparent electrode layer material film by an etching method using the first insulating layers and the second insulating layers as masks to form patterned first transparent electrode layers and patterned second transparent electrode layers and to leave the first insulating layers and the second insulating layers unremoved,
   the forming of the first insulating layers and the second insulating layers including
      forming the first non-insulating regions in the first insulating layers, the first non-insulating regions exposing the first metal electrode layers and being arranged on first straight lines extending in a first direction along the one main surface of the semiconductor substrate, and
      forming the second non-insulating regions in the second insulating layers, the second non-insulating regions exposing the second metal electrode layers and being arranged on second straight lines extending in the first direction and differing from the first straight lines.

2. The method for manufacturing the solar cell according to claim 1, wherein
   in the forming of the first metal electrode layers and the second metal electrode layers, the first metal electrode layers and the second metal electrode layers that each have a strip-like shape extending in a second direction and that are alternately arranged in the first direction are formed, the second direction being along the one main surface and intersecting with the first direction, and
   in the forming of the first insulating layers and the second insulating layers, the first non-insulating regions and the second non-insulating regions are formed on the first straight lines and the second straight lines that intersect with the first metal electrode layers and the second metal electrode layers, and that are alternately arranged in the second direction.

* * * * *